United States Patent
Yang et al.

(10) Patent No.: US 12,259,709 B2
(45) Date of Patent: *Mar. 25, 2025

(54) SEMICONDUCTOR MANUFACTURING SYSTEM, BEHAVIOR RECOGNITION DEVICE AND SEMICONDUCTOR MANUFACTURING METHOD

(71) Applicant: TAIWAN SEMICONDUCTOR MANUFACTURING COMPANY LTD., Hsinchu (TW)

(72) Inventors: Kai-Ting Yang, Taichung (TW); Li-Jen Ko, Hsinchu County (TW); Hsiang Yin Shen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/518,464

(22) Filed: Nov. 23, 2023

(65) Prior Publication Data
US 2024/0094705 A1 Mar. 21, 2024

Related U.S. Application Data

(63) Continuation of application No. 16/996,832, filed on Aug. 18, 2020, now Pat. No. 11,860,607.

(51) Int. Cl.
*G05B 19/4099* (2006.01)
*H01L 21/67* (2006.01)

(52) U.S. Cl.
CPC ........... *G05B 19/4099* (2013.01); *G05B 2219/45031* (2013.01); *H01L 21/67155* (2013.01); *H01L 21/67276* (2013.01)

(58) Field of Classification Search
CPC ............ G05B 19/4099; G05B 19/4148; G05B 19/41885; G05B 2219/45031;
(Continued)

(56) References Cited

U.S. PATENT DOCUMENTS 6,185,516 B1 * 2/2001 Hardin ................ G06F 30/3323
703/2
10,937,676 B2 * 3/2021 Asai .................. H01L 21/67276
(Continued)

OTHER PUBLICATIONS

Mourtzis, Dimitris. "Simulation in the design and operation of manufacturing systems: state of the art and new trends." International Journal of Production Research 58, No. 7 (2020): 1927-1949. Published online: Jul. 4, 2019) (Year: 2019).*
(Continued)

*Primary Examiner* — Douglas Kay
(74) *Attorney, Agent, or Firm* — WPAT LAW; Anthony King (57) ABSTRACT

A behavior recognition device for recognizing behaviors of a semiconductor manufacturing apparatus includes a storage device and a control unit. The storage device is configured to store log data of the semiconductor manufacturing apparatus. The control unit is cooperatively connected to the storage device, and configured to build a transition state model based on the log data to analyze behaviors related to wafer transfer sequences and manufacturing operations of the semiconductor manufacturing apparatus.

20 Claims, 9 Drawing Sheets

(58) Field of Classification Search
CPC ........... G05B 2219/31356; G05B 2219/32356;
G05B 2219/32339; H01L 21/67155;
H01L 21/67276; H01L 21/67253; H01L
21/67259; H01L 21/67167; Y02P 90/02
See application file for complete search history.

(56) References Cited

U.S. PATENT DOCUMENTS

| | | | |
|---|---|---|---|
| 11,860,607 B2* | 1/2024 | Yang | G05B 19/4099 |
| 2022/0057775 A1* | 2/2022 | Yang | H01L 21/67253 |
| 2022/0171373 A1* | 6/2022 | Chau | C23C 14/54 |
| 2024/0094705 A1* | 3/2024 | Yang | H01L 21/67167 |

OTHER PUBLICATIONS

Detty, Richard B., and Jon C. Yingling. "Quantifying benefits of conversion to lean manufacturing with discrete event simulation: a case study." International journal of production research 38, No. 2 (2000): 429-445 (Year: 2000).*

* cited by examiner

SEMICONDUCTOR MANUFACTURING SYSTEM, BEHAVIOR RECOGNITION DEVICE AND SEMICONDUCTOR MANUFACTURING METHOD

PRIORITY CLAIM AND CROSS-REFERENCE

The present application is a continuation application of U.S. patent application Ser. No. 16/996,832 filed on Aug. 18, 2020, which is incorporated herein by reference in its entirety.

BACKGROUND

The manufacturing of semiconductor devices involves many operations, including deposition, photolithography, etching, and the like. Each of the above operations may include several different sub-operations, and these sub-operations may be performed in a multi-chamber type cluster semiconductor manufacturing apparatus. The multi-chamber type cluster semiconductor manufacturing apparatus may be used to deal with a plurality of wafers at the same time, thereby increasing throughput. The multi-chamber type cluster semiconductor manufacturing apparatus includes a series of heterogeneous manufacturing units for performing different operations or sub-operations, and the operation of the multi-chamber type cluster semiconductor manufacturing apparatus is very complex. Thus, it is difficult to capture the root cause of productivity loss.

BRIEF DESCRIPTION OF THE DRAWINGS

Aspects of the embodiments of the present disclosure are readily understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Figure 1:
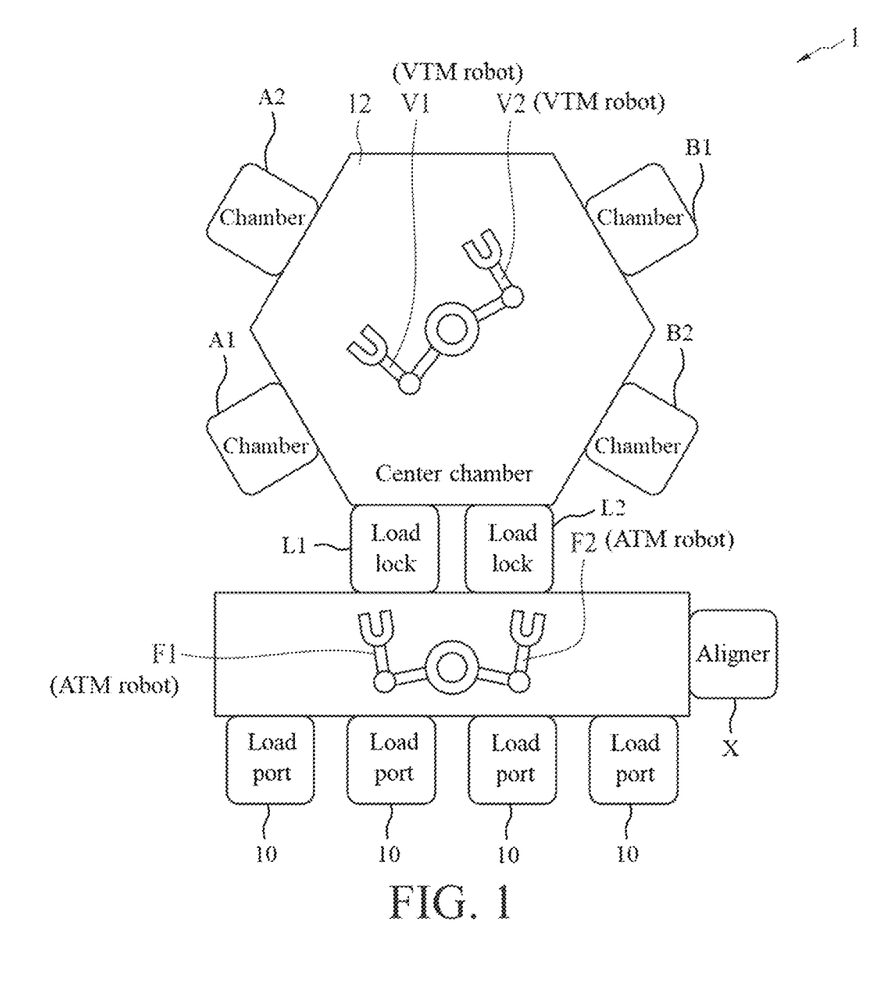
FIG. 1 is a schematic view diagram illustrating a multi-chamber type cluster semiconductor manufacturing apparatus in accordance with some embodiments of the present disclosure.

Refer to FIG. 1. FIG. 1 is a schematic view diagram illustrating a multi-chamber type cluster semiconductor manufacturing apparatus in accordance with some embodiments of the present disclosure. As shown in FIG. 1, the multi-chamber type cluster semiconductor manufacturing apparatus 1 may include a series of heterogeneous manufacturing units configured to perform different operations or implement different functions. In some embodiments, the manufacturing units may include load ports (e.g., front opening unified pod (FOUP)) 10, atmosphere transfer module (ATM) robots F1, F2, an aligner X, load locks L1, L2, vacuum transfer module (VTM) robots V1, V2, first processing chambers such as chambers A1, A2, and second processing chambers such as chambers B1, B2. The load ports 10 are configured to place cassettes for storing wafers. The ATM robots F1, F2 are configured to transfer wafers between the load ports 10 and the load locks L1, L2 in an atmospheric environment. The VTM robots V1, V2 are configured to transfer the wafer in the vacuum environment. The wafer is transferred to the aligner X for calibrating the orientation of the wafer before transferring to the load lock L1 or L2. The load locks L1, L2 are spaces configured to load-in and load-out the wafer. When the wafer is load-in, a front door of the load lock L1 or L2 opens to receive the wafer from the ATM robot F1 or F2. The front door is then closed, and the load lock L1 or L2 is pumped to a vacuum environment. A back door of the load lock L1 or L2 then opens, and the wafer is transferred to the chamber A1 or A2 by the VTM robot V1 or V2. When the wafer is load-out, the back door of the load lock L1 or L2 opens to receive the wafer from the VTM robot V1 or V2. The back door of the load lock L1 or L2 is then closed, and the load lock L1 or L2 is ventilated to an atmospheric environment. The front door of the load lock L1 or L2 then opens, and the wafer is transferred to the load port 10 by the ATM robot F1 or F2. In some embodiments, the first processing chambers A1, A2 and the second processing chambers B1, B2 include different types of processing chambers for performing different operations, and may be in communication with a center chamber 12.

In some embodiments, the multi-chamber type cluster semiconductor manufacturing apparatus 1 may include but is not limited to, for example a deposition apparatus such as a physical vapor deposition (PVD) apparatus. The first processing chambers A1, A2 may be configured to pre-heat the wafers. The second processing chambers B1, B2 may be configured to perform PVD operation on the wafers. In some other embodiments, the multi-chamber type cluster semiconductor manufacturing apparatus 1 may include a chemical vapor deposition (CVD) apparatus, etching apparatus, a photolithography apparatus or the like.

As shown in FIG. 1, the multi-chamber type cluster semiconductor manufacturing apparatus 1 can perform manufacturing operations on multiple wafers simultaneously and/or successively. At a time point, some wafers may be processed in the first processing chambers A1, A2 and the second processing chambers B1, B2, some wafers may be handled by the ATM robots F1, F2 and the VTM robots V1, V2, some wafers may be in the load locks L1 and L2, and some wafers may be waiting to load-in. The manufacturing operations of the multi-chamber type cluster semiconductor manufacturing apparatus 1 are complex and continuously performed. Once one of the manufacturing operations for a wafer is idled, it may affect the manufacturing operations of other wafers, and it is very difficult to capture the root cause of the idle.

In one or more embodiments of the present disclosure, a behavior recognition device cooperatively connected to one or more semiconductor manufacturing apparatuses is used to process log data of the one or more semiconductor manufacturing apparatuses, and to analyze behaviors related to manufacturing operations of manufacturing units of the one or more semiconductor manufacturing apparatuses. The behavior recognition device can real-time receive the log data the one or more semiconductor manufacturing apparatuses as long as they are generated during the manufacturing operations are performed.

The behavior recognition device can real-time process the log data, and automatically build a machine learning model such as a transition state model. The machine learning model can automatically recognize the behaviors of all the manufacturing units, and generate behavior attributions for each wafer. Accordingly, the machine learning model can identify good/bad behaviors and capture the root cause of the bad behaviors with high accuracy. That is, behavior attributions can be learned.

As used herein, the good/bad behaviors may be identified in terms of productivity. The good/bad behaviors may include good/bad sequences and good/bad activities. A good sequence refers to a wafer transfer sequence having higher transition probability and/or standard loop of the wafer transfer sequences, while a bad sequence refers to a wafer transfer sequence having lower transition probability and/or redundant loop. A good activity refers to an activity of a manufacturing unit having, lower time consumption and/or consistent with the activities of other manufacturing units, while a bad activity refers to an activity of a manufacturing unit having higher time consumption and/or inconsistent with the activities of other manufacturing units.

The behavior recognition device can further perform a simulation based on the transition state model. In some embodiments, the transition state model can be output to a simulator, all the behaviors including the good behaviors and had behaviors can be reproduced in the simulator, and the manufacturing operations in the transition state model can be simulated by adjusting the control rule of the bad behavior. When the simulation result shows that adjusting the control rule can fix the bad behavior, the adjusted control rule can be adopted to perform the manufacturing operations on a new batch of wafers with the adjusted control rule.

Figure 2:
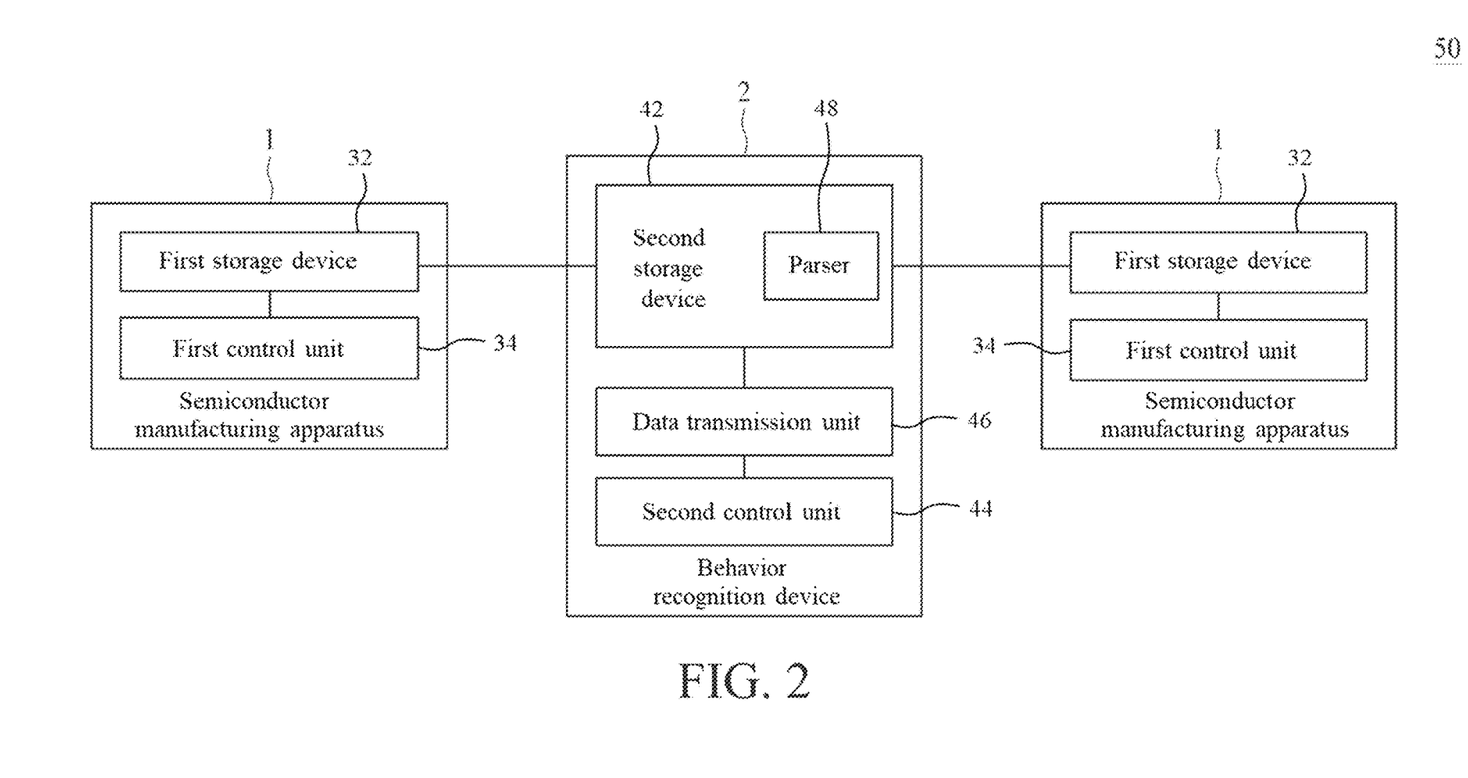
FIG. 2 is a schematic view diagram illustrating a semiconductor manufacturing system in accordance with some embodiments of the present disclosure.

FIG. 2 is a schematic view diagram illustrating a semiconductor manufacturing system in accordance with some embodiments of the present disclosure. As shown in FIG. 2, the semiconductor manufacturing system 50 may include at least one semiconductor manufacturing apparatus 1, and a behavior recognition device. The semiconductor manufacturing apparatus 1 may include a multi-chamber type cluster semiconductor manufacturing apparatus 1 as illustrated in FIG. 1. The behavior recognition device 2 is cooperatively connected to the semiconductor manufacturing apparatus 1. As shown in FIG. 2, the behavior recognition device 2 is cooperatively connected to two semiconductor manufacturing apparatuses 1 for example. The number of the semiconductor manufacturing apparatus 1 is not limited.

In addition to the manufacturing units as illustrated in FIG. 1, the semiconductor manufacturing system 50 may include a first control unit 34 and a first storage device 32. The first control unit 34 is configured to control the manufacturing operations of the series of manufacturing units based on the control rules. In some embodiments, the control rules may include the job handling sequences of the manufacturing units, the wafer transfer sequence, operation parameters, etc. The first control unit 34 is also configured to generate log data recording the manufacturing operations of the series of manufacturing units. In some embodiments, the control rules of the semiconductor manufacturing system 50 are set by vendors, and may not be all known to the manufacturers. The log data, however, may record every manufacturing operation such as what each manufacturing unit does and how long each manufacturing operation lasts in terms of time. The first storage device 32 is cooperatively connected to the first control unit 34 and configured to store the log data transferred from the first control unit 34.

The behavior recognition device 2 includes a second storage device 42, and a second control unit 44. The second storage device 42 is cooperatively connected to the first control unit 34 of the semiconductor manufacturing apparatus 1, and configured to store the log data transferred from the first control unit 34. In some embodiments, the first control unit 34 not only transfers the log data to the first storage unit 32 of the semiconductor manufacturing apparatus 1, but also duplicates the log data and transfers to the second storage device 42 of the behavior recognition device 2. The first control unit 34 can transfer the log data to the second storage device 42 of the behavior recognition device 2 and to the first storage device 32 of the semiconductor manufacturing apparatus 1 in a real-time manner as the log data is generated, or in a postponed manner. The second control unit 44 is cooperatively connected to the second storage device 42, and configured to receive the log data from the second storage device 42. The second control unit 44 can also build a transition state model to analyze behaviors related to the manufacturing operations of the series of manufacturing units based on the log data.

In some embodiments, the first control unit 34 and the second control unit 44 are two micro control units (MCUs), and each may include a processor such as a central processing unit (CPU). The first control unit 34 and the second control unit 44 each may further include embedded memory for storing instructions. In some embodiments, the first storage device 32 and the second storage device 42 are two storage devices such as hard disks or the like. In some embodiments, the second storage device 42 of the behavior recognition device 2 may include a network attached storage (NAS). The second storage device 42 may be connected to the semiconductor manufacturing apparatus 1 in a wired manner or a wireless manner.

In some embodiments, instead of processing the log data in the first storage device 32, the second control unit 44 processes the log data in the second storage unit 42. This would minimize the work load of the first control unit 34 and the first storage device 32, and thus would reduce the risk of overload occurring in the semiconductor manufacturing apparatus 1. In some other embodiments, the first control unit 34 and the second control unit 44 may be a control unit and/or the first storage device 32 and the second storage device 42 may be a storage device, as long as the computing and data accessing abilities are high enough to perform both the manufacturing operations and the analysis of the log data at the same time.

In some embodiments, the behavior recognition device 2 may further include a data transmission unit 46 cooperatively connected to the second storage device 42 and the second control unit 44. The data transmission unit 46 may include an interface configured to transfer the log data of the semiconductor manufacturing apparatus 1 from the second storage device 42 to the second control unit 44 in a real-time manner or in a postponed manner.

In some embodiments, the log data of different manufacturing units and/or different semiconductor manufacturing apparatuses 1 may be recorded in different formats. The second control unit 44 of the behavior recognition device 2 may further include a parser 48 configured to convert the log data recording the manufacturing operations of the manufacturing units in different formats into a uniform format as an input of the second control unit 44. In some embodiments, the parser 48 can be implemented by a hardware device. Additionally or alternatively, the parser can be implemented by software or firmware.

Figure 3A:
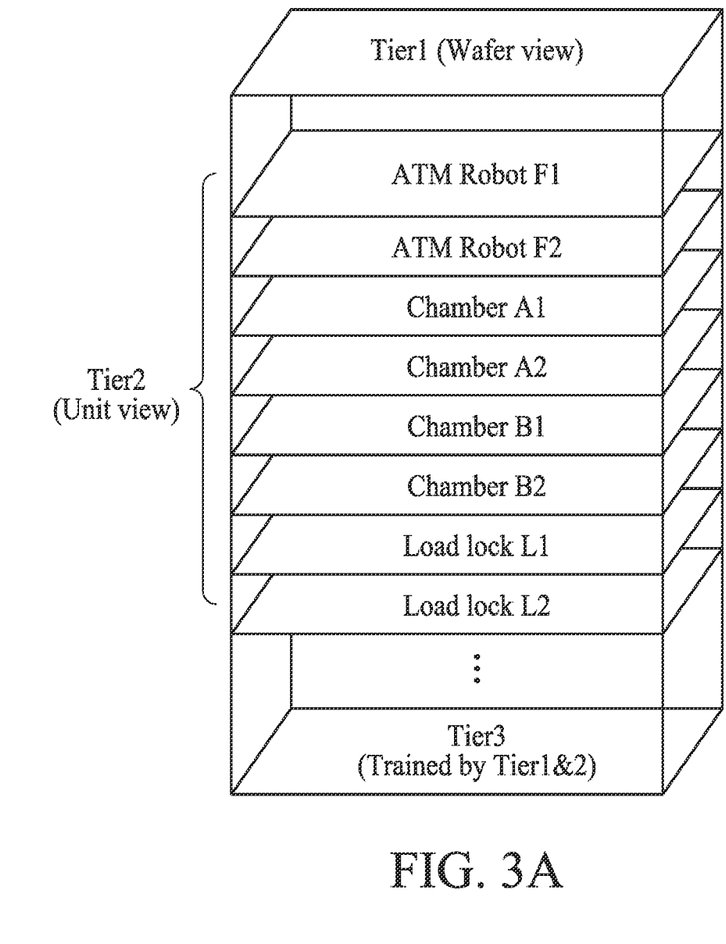
FIG. 3A is a schematic diagram of a machine learning model in accordance with some embodiments of the present disclosure.

Referring to FIG. 3A. FIG. 3A is a schematic diagram of a machine learning model in accordance with some embodiments of the present disclosure. As shown in FIG. 3A, the machine learning model includes multiple tiers configured to execute different learning procedures. The machine learning model may adopt Neutral Network based algorithm. In some embodiments, the machine learning model includes a first tier (Tier 1), a second tier (Tier 2) and a third tier (Tier 3).

Tier 1 may be configured to perform a unit correlation learning from the perspective of each wafer (Wafer view). In Tier 1, wafer transfer sequences and time consumption for each of the wafers in the manufacturing units based on the log data are learned to construct a transition state model of wafer transfer sequences, Tier 2 may be configured to learn the activity for each manufacturing unit from the perspective of each manufacturing unit (Unit view). In tier 1, normal sequence and abnormal sequence can be identified based on the transition probabilities and/or loops of the wafer transfer sequences.

In Tier 2, the manufacturing operations of each manufacturing unit before and after arrivals of the wafers are learned to construct a transition state model of manufacturing unit operations. For example, the manufacturing operations of each of the manufacturing units such as ATM robot F1 or F2, VTM robot V1 or V2, first processing chamber A1 or A2, second processing chamber B1 or B2, load lock L1 or L2 are learned. In Tier 2, the mapping between the wafer transfer sequence and the manufacturing operations of the manufacturing units may also be learned. In Tier 2, the manufacturing cycles of the manufacturing operations of the manufacturing units and a time consumption of each activity in the manufacturing cycles can be learned, and normal activity and abnormal activity can be identified based on the time consumption and the manufacturing cycles.

Tier 3 may be configured to analyze behaviors related to the manufacturing operations of the series of manufacturing units. In tier 3, good/bad sequences can be identified from the normal/abnormal sequences, and good/bad activities can be identified from the normal/abnormal activities in terms of productivity. For example, bad sequence or bad activity can be confirmed in case this sequence or activity results in productivity loss compared to other sequences or activities. Furthermore, tier 3 may further learn behavior attributions for the bad behaviors, and to capture a root cause of the bad behavior based on the behavior attributions. Tier 3 may be configured to learn control rules of the good behaviors and the bad behavior to construct a transition state model by cross learning between Tier 1 and Tier 2 after Tier 1 and Tier 2 trained a plurality of wafers. In some embodiments, the transition state models constructed in Tier 1, Tier 2 and/or Tier 3 may include but are not limited to, for example Markov chain model.

As shown in FIG. 3A, the machine learning model is constructed by multiple learning planes (e.g., Tier 1 and Tier 2), and one cross learning plane (e.g., Tier 3) so that the machine learning model may also be referred to as a 3D self-expansive cascade machine learning model.

Figure 3B:
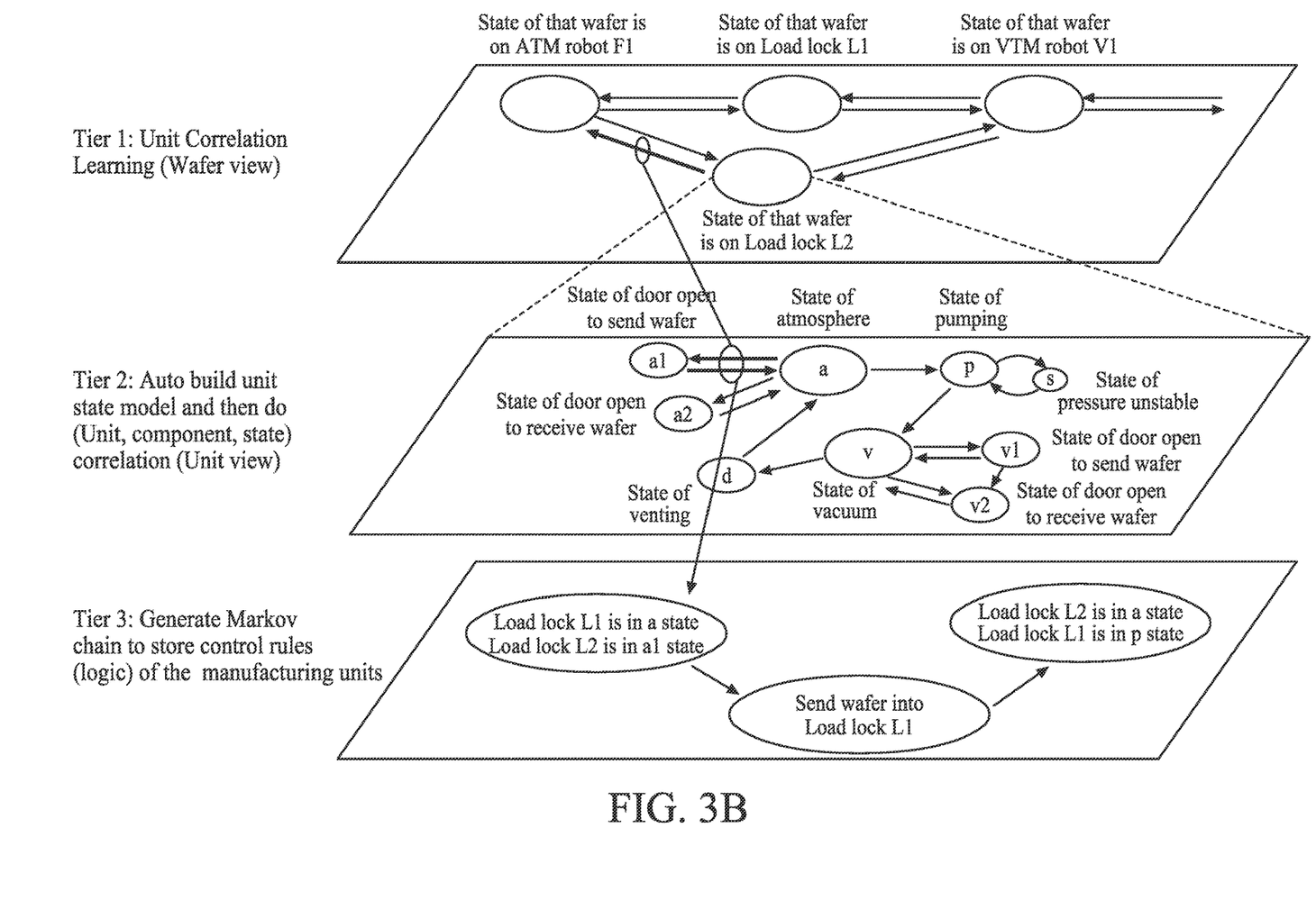
FIG. 3B is a schematic diagram illustrating transition states of the machine learning model of FIG. 3A in accordance with some embodiments of the present disclosure.

Refer to FIG. 3B. FIG. 3B is a schematic diagram illustrating transition states of the machine learning model of FIG. 3A in accordance with some embodiments of the present disclosure. In Tier 1, wafer transfer sequences and time consumption for each of the wafers in the manufacturing units based on the log data are learned to construct a transition state model of wafer transfer sequences. For example, the wafer transfer sequences among the ATM robot F1, the load locks L1 and L2 and the VTM robot V1, and the time consumption of the wafer among the above manufacturing units are learned from the log data to construct a transition state model such as Markov chain model. In the Markov chain model, each location of the wafer represents a state, and the probability of the Markov process changing from one state to another state (indicated by an arrow) can be learned from the log data.

In Tier 2, the activities of each manufacturing operation for each manufacturing unit are learned to construct another transition state model. For example, the activities of the load lock L2 are learned from the log data. The load lock L2 may be in state a in which the load lock L2 is in atmospheric state, and several activities may be executed when the load lock L2 in state a. The load lock L2 may transitioned from state a to state a1 in which the front door of the load lock L2 is open to send a wafer. The load lock L2 may be transitioned from state a to state a2 in which the front door of the load lock L2 is open to receive a wafer. The load lock L2 may be transitioned from state a to state p in which the load lock L2 is pumped. The load lock L2 may be transitioned from state p to state v in which the load lock L2 is vacuumed. The load lock L2 may be transitioned from state v to state v1 in which the back door of the load lock L2 is open to send a wafer. The load lock L2 may be transitioned from state v to state v2 in which the back door of the load lock L2 is open to receive a wafer. The load lock L2 may be transitioned from state v to state d in which the load lock L2 is ventilated. The load lock L2 may be transitioned from state d to state a in which the load lock L2 is in atmospheric state. In some embodiments, the load lock L2 may be transitioned from state p to state s in which the pressure in the load lock L2 is unstable based on the log data. The state s may be identified as an abnormal behavior based on the occurrence probability and/or time consumption from the log data. Similar to the activities of the load lock L2, the activities of other manufacturing units can be learned to construct a transition state model.

In Tier 3, the transition state models of Tier 1 and Tier 2 are cross referred to construct a transition model to identify the good/bad sequences from the normal/abnormal sequences learned from tier 1, and to identify the good/bad activities from the normal/abnormal activities from tier 2. Tier 3 can also learn the control rules including job handling sequences of the manufacturing units, operation parameters, time consumption, etc.

Figure 4:
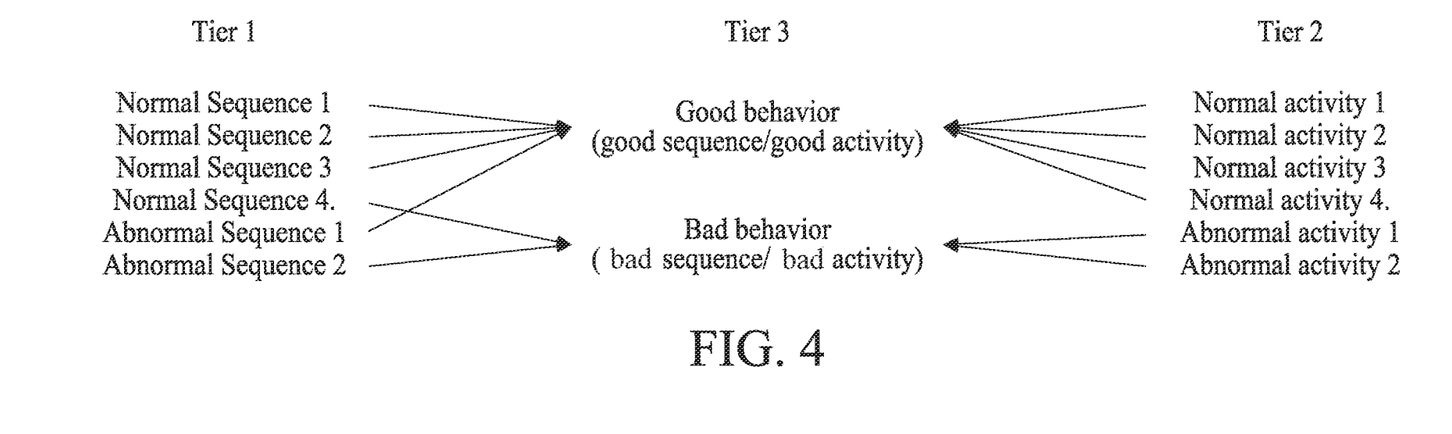
FIG. 4 is a schematic diagram illustrating the relation between good/bad sequences and normal/abnormal sequences, and the relation between good/bad activities and normal/abnormal activities.

FIG. 4 is a schematic diagram illustrating the relation between good/bad sequences and normal/abnormal sequences, and the relation between good/bad activities and normal/abnormal activities. As shown in FIG. 4, the bad sequence identified in tier 3 may be identified as either a normal sequence or an abnormal sequence in tier 1, and the bad activity identified in tier 3 may be identified as either a normal activity or an abnormal activity in tier 2.

The machine learning model may output the control rules of the manufacturing units of the semiconductor manufacturing apparatus based on the log data, and behaviors of the manufacturing units can be evaluated to find the root cause of an abnormal behavior.

Figure 5:
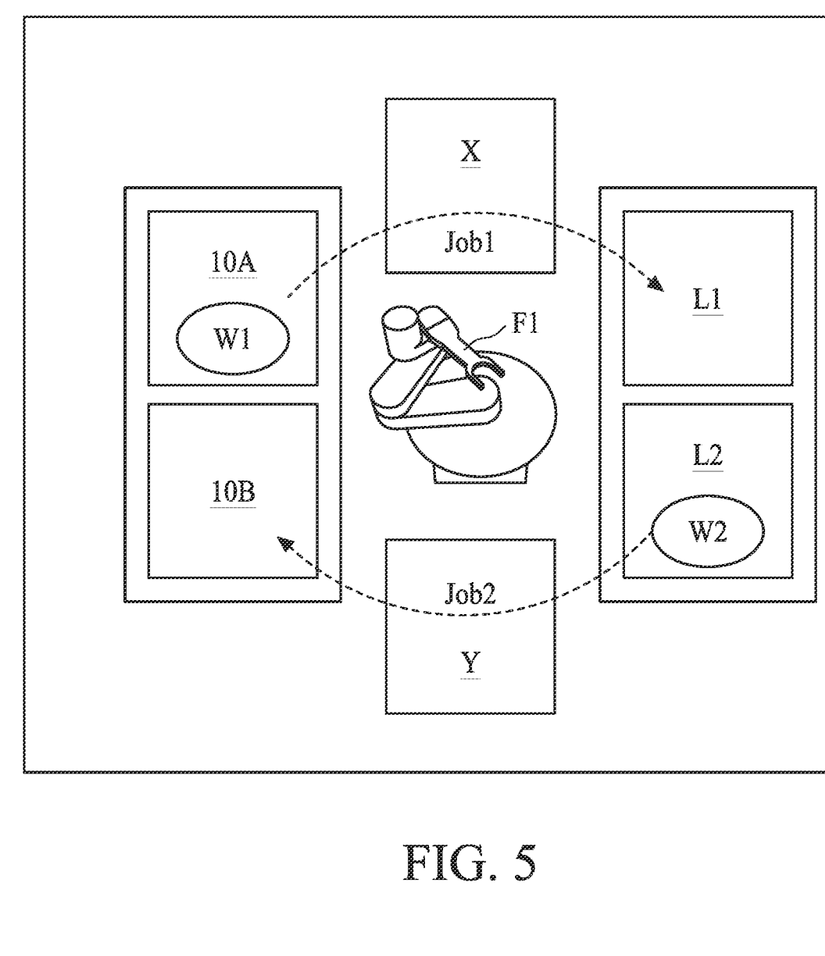
FIG. 5 is a schematic diagram illustrating job execution order of an atmosphere transfer module (ATM) robot between the load ports and load locks in accordance with some embodiments of the present disclosure.

Refer to FIG. 5. FIG. 5 is a schematic diagram illustrating job execution order of an ATM robot between the load ports (e.g., FOUP) and load locks in accordance with some embodiments of the present disclosure. As shown in FIG. 5, Job 1 is an activity that transfers a wafer W1 from load port 10A to load lock L1 by an ATM robot F1, and Job 2 is an activity that transfers a wafer W2 from load lock L2 to load port 10B by an ATM robot F1. In some embodiments, the wafer W1 may be aligned by an aligner X in Job 1, and the wafer W2 may be cooled in a cool station Y in Job 2. In some embodiments, the default location of the ATM robot F1 is set to be closer to the load ports 10A, 10B.

Table 1 lists the control rules of Job 1 and Job 2 and waste time in different job order based on the output of the machine learning model learned from the log data.

TABLE 1

| Job queue | Job order | Control rules | Waste time |
| --- | --- | --- | --- |
| 1 | Job 1 | Job 1 arrives; Job 2 does not arrive | 0 second |
| 1 | Job 1 | Job 2 arrives; Job 1 does not arrive | 0.3 seconds |
| 2 | Job 2 | Job 2 arrival is ahead of Job 1 shorter than or equal to 6 seconds | 6.7 seconds |
| 2 | Job 2 | Job 2 arrival is ahead of Job 1 longer than 6 seconds | 0.4 seconds |

As shown in Table 1, the control rule shows the higher priority of Job 1 causes the 6.7 seconds of waste time. Accordingly, this control rule may be reconsidered to reduce the waste time.

Figure 6:
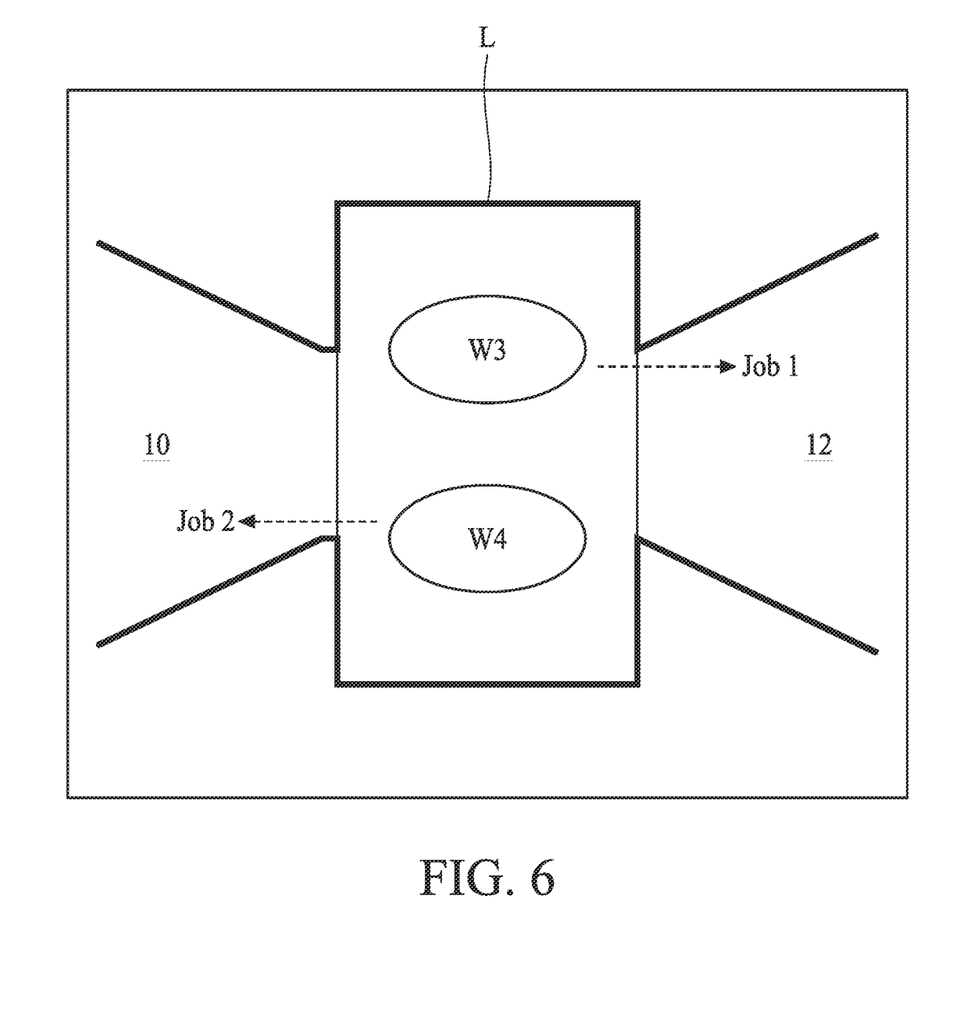
FIG. 6 is a schematic diagram illustrating job execution order of a load lock in accordance with some embodiments of the present disclosure.

Refer to FIG. 6. FIG. 6 is a schematic diagram illustrating job execution order of a load lock in accordance with some embodiments of the present disclosure. The load lock L may include a stack load lock which can accommodate two wafers W3 and W4. As shown in FIG. 6, wafer W3 is an un-processed wafer to be transferred to the main frame such as the center chamber 12 of the semiconductor manufacturing apparatus, and wafer W4 is a processed wafer to be transferred from the center chamber 12 to the load port 10. The load lock L is in a vacuum state, and wafers W3 and W4 are in the load lock L. Job 1 is an activity that keeps the load lock L vacuumed, and transfer to an available manufacturing unit when available. Job 2 is an activity that ventilates the load lock L to an atmospheric state, and transfer wafer W4 to the load port 10.

Table 2 lists the control rules of Job 1 and Job 2 and waste time in different job order based on the output of the machine learning model learned from the log data.

TABLE 2

| Job queue | Job order | Control rules | Waste time |
| --- | --- | --- | --- |
| 1 | | Wafer W3 > Wafer W4 | Wafer 4 does not arrive | 0 second |
| 2 | | Wafer W4 > Wafer W3 | Wafer W4 arrives | 17.4 seconds |

As shown in Table 2, the control rule shows the control unit will switch the load lock L from the atmospheric state to the vacuumed state when any processed wafer arrives, which cause 17.4 seconds of waste time. Accordingly, this control rule may be reconsidered to reduce the waste time.

In some embodiments of the present disclosure, the behavior recognition device cooperatively connected to the semiconductor manufacturing apparatus can construct a transition state model based on the log data to automatically recognize the behaviors including the sequences of all the wafers and the activities of all the manufacturing units, and generate behavior attributions for each wafer. Accordingly, the machine learning model can identify good/bad sequences of the wafers and good/bad activities of the manufacturing units, and capture the root cause(s) of the bad behaviors with high accuracy. The machine learning model can further learn the control rules related to the bad behaviors and the control rules related to the bad behavior, thereby capturing the root cause.

Figure 7:
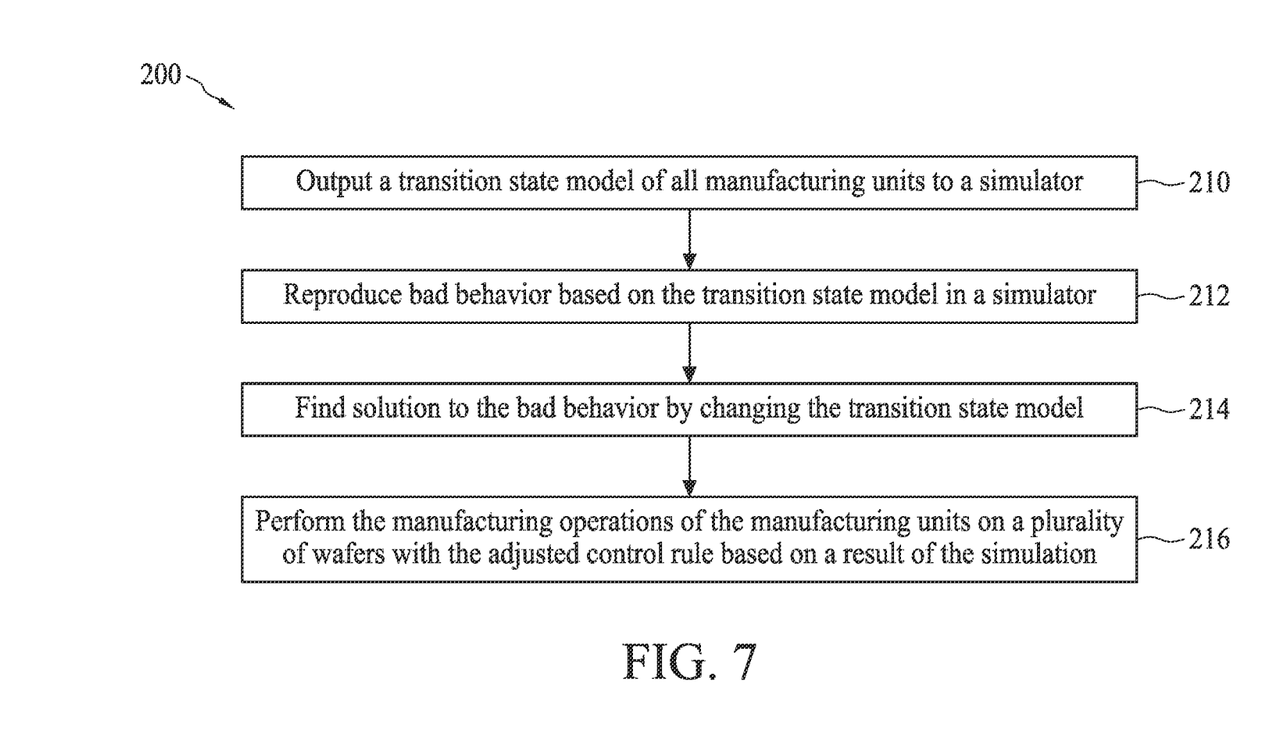
FIG. 7 is a flow chart illustrating a semiconductor manufacturing method in accordance with various aspects of one or more embodiments of the present disclosure.

Refer to FIG. 7. FIG. 7 is a flow chart illustrating a semiconductor manufacturing method in accordance with various aspects of one or more embodiments of the present disclosure. The method 200 may proceed with operation 210 followed by method 100 in which a transition state model of all manufacturing units is output to a simulator. The method 200 proceeds with operation 212 in which the bad behavior is reproduced based on the transition state model in the simulator. The method 200 proceeds with operation 214 in which the solution to the bad behavior is found by changing the transition state model. The method 200 proceeds with operation 216 in which the manufacturing operations of the manufacturing units are performed on a plurality of wafers with the adjusted control rule based on a result of the simulation.

The method 200 is merely an embodiment, and is not intended to limit the present disclosure beyond what is explicitly recited in the claims. Additional operations can be provided before, during, and after the method 200, and some operations described can be replaced, eliminated, or moved around for additional embodiments of the method.

The behavior recognition device can further perform a simulation based on the transition state model. In some embodiments, the transition state model can be output to a simulator, all the behaviors including, the abnormal behavior can be reproduced in the simulator, and the manufacturing operations in the transition state model can be simulated by adjusting the control rule of the abnormal behavior. When the simulation result shows that adjusting the control rule can fix the abnormal behavior, the adjusted control rule can be adopted to perform the manufacturing operations on a new batch of wafers with the adjusted control rule.

Figure 8:
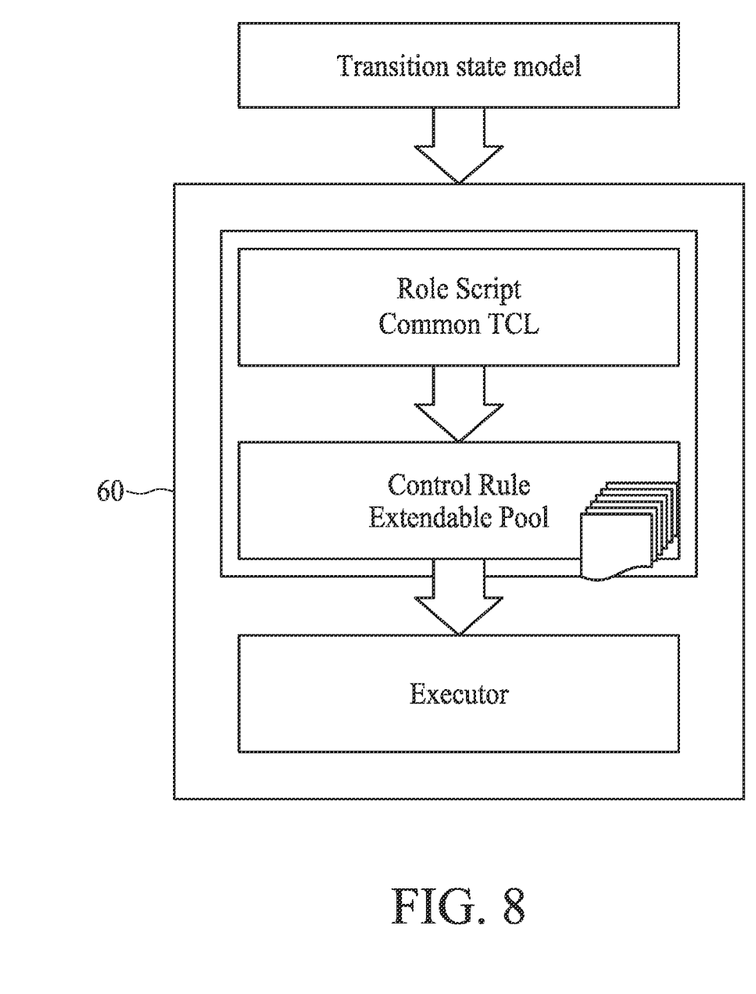
FIG. 8 is a schematic diagram illustrating a scheme of a simulator in accordance with some embodiments of the present disclosure.

FIG. 8 is a schematic diagram illustrating a scheme of a simulator in accordance with some embodiments of the present disclosure. As shown in FIG. 8, the transition state model constructed based on the log data can be output to a simulator 60. In some embodiments, the manufacturing operations, optional parameters and control rules of the manufacturing units of the semiconductor manufacturing apparatus can be stored using a universal tool command language (TCL) application or interface, and configured as role scripts. The simulator 60 may include control unit to perform the simulation, and storage device to store the transition state model. In some embodiments, the control unit and/or the storage device of the simulator 60 may be different from that of the behavior recognition device. In some other embodiments, the simulator 60 and the behavior recognition device may share common control unit and/or storage device. A simulation can be executed by an executor of the simulator 60 to reproduce the behavior of the manufacturing units of the semiconductor manufacturing apparatus. The reproduction of the behavior of the manufacturing units of the semiconductor manufacturing apparatus can be configured to calibrate the simulator 60. When the simulation result is similar to the manufacturing operation of the manufacturing units, the manufacturing operations can be simulated in the transition state model by adjusting the control rule of the manufacturing units. When the adjusted control rule improves the performance (e.g., reduction of waste time) in the simulation result, the adjusted control rule can be adopted to perform the manufacturing operations of the series of manufacturing units on a plurality of wafers in real manufacturing.

In some embodiments of the present disclosure, a behavior recognition device cooperatively connected to one or more semiconductor manufacturing apparatuses is used to process log data of the one or more semiconductor manufacturing apparatuses, and to analyze behaviors related to wafer transfer sequences and manufacturing operations of manufacturing units of the one or more semiconductor manufacturing apparatuses. The behavior recognition device can automatically build a machine learning model such as a transition state model. The machine learning model can automatically recognize the behaviors of all the wafers and the manufacturing units, and generate behavior attributions for each wafer and each activity of each manufacturing unit. Accordingly, the machine learning model can identify good behaviors and bad behaviors of the manufacturing units in terms of productivity loss, capture the root cause(s) of the bad behaviors, and learn the control rules of the manufacturing units. The behavior recognition device can further perform a simulation based on the transition state model.

In some embodiments, a semiconductor manufacturing system includes at least one semiconductor manufacturing apparatus, and a behavior recognition device. The least one semiconductor manufacturing apparatus includes a series of manufacturing units, a first control unit and a first storage unit. The series of manufacturing units are configured to perform manufacturing operations on wafers. The first control unit is configured to control the manufacturing operations of the series of manufacturing units, and generate log data recording the manufacturing operations of the series of manufacturing units. The first storage device is cooperatively connected to the first control unit and configured to store the log data transferred from the first control unit. The behavior recognition device is cooperatively connected to the semiconductor manufacturing apparatus. The behavior recognition device includes a second storage device and a second control unit. The second storage device is cooperatively connected to the first control unit of the semiconductor manufacturing apparatus, and configured to store the log data transferred from the first control unit. The second control unit is cooperatively connected to the second storage device, and configured to receive the log data from the second storage device and build a transition state model to analyze behaviors related to the manufacturing operations of the series of manufacturing units based on the log data.

In some embodiments, a semiconductor manufacturing method includes the following operations. Inputs of log data recording manufacturing operations of a series of manufacturing units of at least one semiconductor manufacturing apparatus performed on a plurality of wafers are received by a storage device. A transition state model is built by a control unit based on the log data. The transition state model performs analyzing behaviors related to wafer transfer sequence and activities of the manufacturing operations of the series of manufacturing units based on the log data, generating behavior attributions for the behaviors, and capturing a root cause of a bad behavior based on the behavior attributions.

In some embodiments, a behavior recognition device for recognizing behaviors of a semiconductor manufacturing apparatus includes a storage device, a control unit. The storage device is configured to store log data of the semiconductor manufacturing apparatus. The control unit is cooperatively connected to the storage device, and configured to build a transition state model based on the log data to analyze behaviors related to wafer transfer sequences and manufacturing operations of a plurality of manufacturing units of the semiconductor manufacturing apparatus.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing system, comprising:
   at least one semiconductor manufacturing apparatus, comprising:
      a series of manufacturing units configured to perform manufacturing operations on wafers;
      a first control unit configured to control the manufacturing operations of the series of manufacturing units, and generate log data recording the manufacturing operations of the series of manufacturing units; and
      a first storage device cooperatively connected to the first control unit and configured to store the log data transferred from the first control unit; and
   a behavior recognition device cooperatively connected to the semiconductor manufacturing apparatus, the behavior recognition device comprising:
      a second storage device cooperatively connected to the first control unit of the semiconductor manufacturing apparatus, and configured to store the log data transferred from the first control unit; and
      a second control unit cooperatively connected to the second storage device, and configured to receive the log data from the second storage device and build a transition state model to analyze behaviors related to the manufacturing operations of the series of manufacturing units based on the log data;
   wherein the behavior recognition device is further configured to reproduce an abnormal behavior of the behaviors by performing a simulation based on the transition state model, and adjust a control rule of the manufacturing units according to the reproduced abnormal behavior; and the semiconductor manufacturing apparatus is configured to manufacture a plurality of processed wafers according to the adjusted control rule.

2. The semiconductor manufacturing system of claim 1, wherein the series of manufacturing units comprises heterogeneous manufacturing units configured to perform different manufacturing operations.

3. The semiconductor manufacturing system of claim 2, wherein the heterogeneous manufacturing units comprises load locks, one or more aligners, processing chambers and robots.

4. The semiconductor manufacturing system of claim 1, wherein the first control unit real-time transfers the log data to the second storage device of the behavior recognition device and to the first storage device of the semiconductor manufacturing apparatus.

5. The semiconductor manufacturing system of claim 1, wherein the second storage device of the behavior recognition device includes a network attached storage (NAS).

6. The semiconductor manufacturing system of claim 1, wherein the control rule includes a job handling sequence of the series of manufacturing units, a wafer transfer sequence for each of the wafers in the series of manufacturing units, and time consumption for each of the wafers in the series of manufacturing units.

7. The semiconductor manufacturing system of claim 1, wherein the second control unit of the behavior recognition device comprises a processor configured to process the log data of the semiconductor manufacturing apparatus.

8. The semiconductor manufacturing system of claim 1, wherein the behavior recognition device further comprises a parser configured to convert different formats of the log data of the manufacturing operations of the manufacturing units into a uniform format as an input of the second control unit.

9. The semiconductor manufacturing system of claim 1, wherein the second storage device is further configured to store the transition state model, and the second control unit is further configured to perform the simulation.

10. A semiconductor manufacturing method, comprising:
    receiving, by a storage device, inputs of log data recording manufacturing operations of a series of manufacturing units of at least one semiconductor manufacturing apparatus performed on a plurality of wafers; and
    building a transition state model, by a control unit, based on the log data to:
       identify a bad behavior from behaviors related to wafer transfer sequences and activities of the manufacturing operations of the series of manufacturing units based on the log data;
       reproduce the bad behavior by performing a simulation based on the transition state model;
       adjust a control rule of the manufacturing units according to the reproduced bad behavior; and
       manufacture a plurality of processed wafers by utilizing the adjusted control rule to perform the manufacturing operations of the series of the manufacturing units.

11. The semiconductor manufacturing method of claim 10, further comprising converting, by a parser, different formats of the log data of the manufacturing operations of the manufacturing units into a uniform format as the inputs of the log data.

12. The semiconductor manufacturing method of claim 10, wherein the transition state model comprises a Neural Network model.

13. The semiconductor manufacturing method of claim 10, wherein the transition state model comprises:
    a first tier configured to learn the wafer transfer sequences and a transition probability of each transition in the wafer transfer sequences for each of the wafers in the manufacturing units based on the log data;
    a second tier configured to learn manufacturing cycles of the manufacturing operations of the manufacturing units and a time consumption of each activity in the manufacturing cycles; and
    a third tier configured to analyze behaviors related to the manufacturing operations of the series of manufacturing units by cross learning between the first tier and the second tier.

14. The semiconductor manufacturing method of claim 13, wherein the first tier is further configured to identify normal sequences and abnormal sequences for the wafers based on the transition probabilities and/or loops of the wafer transfer sequences.

15. The semiconductor manufacturing method of claim 14, wherein the second tier is further configured to identify normal activities and abnormal activities based on the time consumption and the manufacturing cycles.

16. The semiconductor manufacturing method of claim 15, wherein the third tier is further configured to identify good sequences and bad sequences from the normal sequences and the abnormal sequences and the good activities and bad activities from the normal activities and the abnormal activities in terms of productivity.

17. The semiconductor manufacturing method of claim 10, wherein reproducing the bad behavior by performing the simulation based on the transition state model comprises:
    outputting the transition state model to a simulator;
    reproducing the behaviors in the simulator; and simulating the manufacturing operations in the transition state model by adjusting the control rule of the manufacturing units.

18. The semiconductor manufacturing method of claim 10, wherein a result of the simulation shows that the bad behavior is fixed when the adjusted control rule is utilized.

19. A behavior recognition device for recognizing behaviors of a semiconductor manufacturing apparatus, comprising:
- a storage device configured to store log data of the semiconductor manufacturing apparatus; and
- a control unit cooperatively connected to the storage device, and configured to build a transition state model based on the log data to analyze behaviors related to wafer transfer sequences and manufacturing operations of a plurality of manufacturing units of the semiconductor manufacturing apparatus;
- wherein the control unit is further configured to perform a simulation based on the transition state model to thereby reproduce an abnormal behavior of the behaviors of the manufacturing units, and adjust a control rule of the manufacturing units according to the reproduced abnormal behavior.

20. The behavior recognition device of claim 19, wherein the transition state model comprises:
- a first tier configured to learn wafer transfer sequences and a transition probability of each transition in the wafer transfer sequences for each wafer in the manufacturing units based on the log data;
- a second tier configured to learn manufacturing cycles of the manufacturing operations of the manufacturing units and a time consumption of each activity in the manufacturing cycles; and
- a third tier configured to analyze behaviors related to the manufacturing operations of the series of manufacturing units by cross learning between the first tier and the second tier.

* * * * *